United States Patent [19]

Bringuel

[11] Patent Number: 4,583,803

[45] Date of Patent: Apr. 22, 1986

[54] ELECTRIC MODULE WITH FAIL-SAFE POWER DISCONNECT

[75] Inventor: Martin C. Bringuel, San Jose, Calif.

[73] Assignee: Tandem Computers Incorporated, Cupertino, Calif.

[21] Appl. No.: 702,185

[22] Filed: Feb. 15, 1985

[51] Int. Cl.⁴ ............................................. H01R 13/62
[52] U.S. Cl. ............................ 339/45 M; 339/108 R; 339/79; 339/78
[58] Field of Search .................................. 339/36–39, 339/45, 46, 78, 79

[56] References Cited

U.S. PATENT DOCUMENTS 3,335,386  8/1967  Upton .............................. 339/45 M

FOREIGN PATENT DOCUMENTS 217318  4/1958  Australia ................................ 339/79
187959  2/1956  Fed. Rep. of Germany ........ 339/79

Primary Examiner—Gil Weidenfeld
Assistant Examiner—David L. Pirlot
Attorney, Agent, or Firm—Townsend and Townsend

[57] ABSTRACT

A connection system for host equipment is disclosed. The system includes a plug-in electronic module and a power supply cable for plug-in connection to said module. The host equipment includes a housing for the module which effectively precludes access to the module except at one exterior end thereof. An end plate at an exterior end of the module includes a handle facilitating removal of the module from the housing. The end plate further comprises a power supply cable jack for mating with a plug of the power supply cable. The jack and the plug are so located and adapted to render ineffective the handle when the plug is mated with the jack, thereby requiring the service personnel to remove the power supply plug from the jack before removing the module from the housing.

3 Claims, 4 Drawing Figures

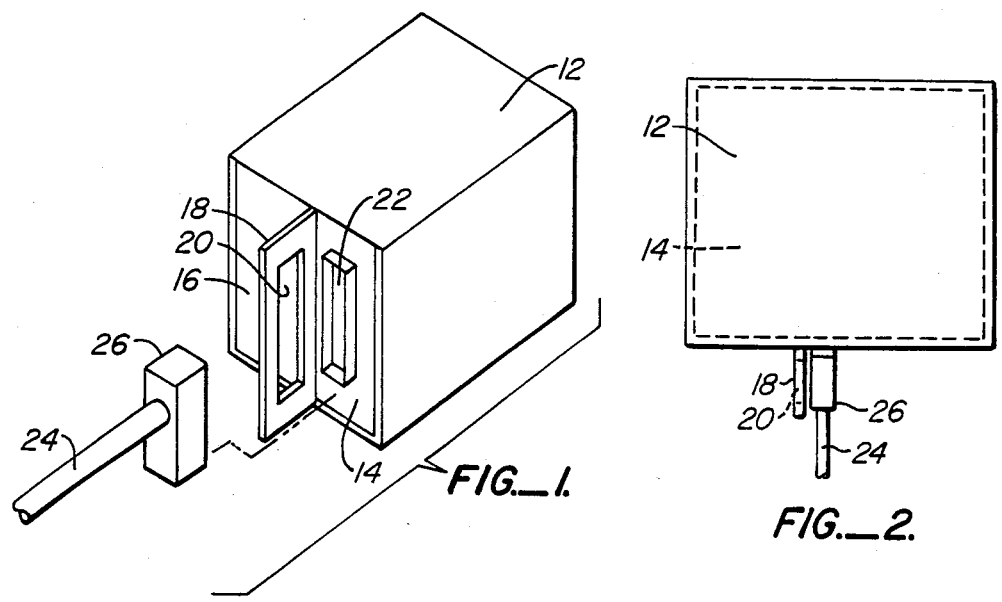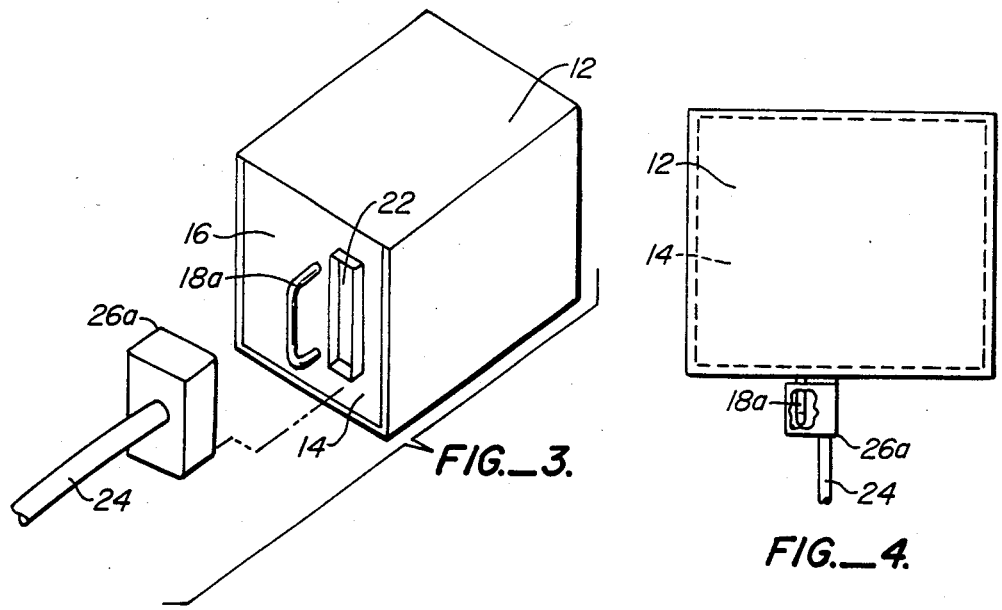

ELECTRIC MODULE WITH FAIL-SAFE POWER DISCONNECT

BACKGROUND OF THE INVENTION

The present invention relates to removable modules containing sensitive electronic circuitry. More particularly, the present invention relates to method and apparatus for ensuring that input/output power cables are disconnected from a removeable module prior to removal of the module from its host equipment during e.g. service operations.

Many products are designed as modules which are removeable from host equipment for service and replacement. Power cables frequently plug into such modules, and it is imperative for the proper servicing of such modules that the power be first removed from the module before it is removed from the host equipment. Failure to remove power prior to module removal has led to failures of modules and to exposure of service personnel to dangerous voltages. A need has arisen for a removable module design which ensures that the power cable is disconnected from the module before it may be removed from the host equipment.

SUMMARY OF THE INVENTION WITH OBJECTS

A general object of the present invention is to provide an improved removeable electronic circuit module which may not be removed from host equipment until a power cable is first disconnected from the module, thereby overcoming limitations and drawbacks of the prior art.

A specific object of the present invention is to provide a removal handle on a removeable electronic circuit module which is effectively rendered inoperative for its intended purpose by the adjacent presence of a power cable plug.

Another object of the present invention is to provide a simple, cost effective, yet highly reliable configuration of plug-in electronic module and power cable in which removal of the power cable from the module thereby makes it possible to remove the module from its host equipment.

A connection system for host equipment includes a plug-in electronic module and a power supply cable for plug-in connection to the module. The system includes a housing for the module defined by the host equipment which effectively precludes service access to the module except at one exterior end thereof. The module includes an end plate at the exterior end of the module, and the end plate includes a handle for facilitating removal of the module from the housing.

The module end plate further comprises a power supply cable jack for mating with a plug of the power supply cable. The jack and the plug are so located and adapted as to render the handle ineffective for removal of the module when the plug is mated with the jack, thereby effectively requiring service personnel to remove the power supply plug from the jack before removing the module from its housing.

In one preferred embodiment the connection system provides a handle which includes an opening to provide a finger grip to facilitate removal of the module from the host equipment housing. In this embodiment the jack is placed adjacent to the handle, and the plug is sized so as to block off the opening in the handle when mated with the jack, thereby effectively preventing removal of the module before disconnection of the power supply cable.

In another preferred embodiment the handle is effectively surrounded by the plug when mated with the jack so that service personnel must remove the plug from the jack in order to gain access to said handle for removing said module from said housing.

These objects, advantages and features will be further appreciated and better understood upon consideration of the following detailed description of preferred embodiments, presented in conjunction with the accompanying drawings.

BRIEF DESCRIPTION OF THE DRAWINGS

In The Drawings:

FIG. 1 is an isometric view of a first preferred embodiment of a connection system incorporating the principles of the present invention.

FIG. 2 is a top plan view of the connection system set forth in FIG. 1.

FIG. 3 is an isometric view of a second preferred embodiment of a connection system incorporating the principles of the present invention.

FIG. 4 is a top plan view in partial section of the connection system set forth in FIG. 3.

DETAILED DESCRIPTION OF PREFERRED EMBODIMENTS

A connection system 10 incorporating the principles of the present invention is illustrated in FIGS. 1 and 2. Therein, the system includes a housing 12 of a host system of some form of electrical/electronic equipment, a removeable module 14 entirely surrounded by the housing 12, except for an exterior face 16 thereof. A handle 18 extends outwardly away from the face 16 and defines an opening 20 which provides a finger grip to facilitate removal of the module 14 from its housing 12.

A jack 22 is mounted in the face 16 adjacently away from the handle. A power supply cable 24 from a power supply, not shown, delivers power and/or data or control signals to the module 14. A plug 26 is attached to the end of the cable, and the plug 26 is so sized so that when it is mated with the jack 22, the left sidewall 28 of the plug 26 effectively blocks off useful access to the finger grip opening 20 in the handle 18.

The arrangement of FIGS. 1 and 2 is thus seen to preclude the use of the handle 18 unless and until the power cable plug 26 is removed from the jack 22. In this manner, the connection system 10 effectively precludes the possibility that service personnel will be able to remove the module 14 from its host equipment housing 12.

An alternative connection system 10a embodying the principles of the present invention is depicted in FIGS. 3 and 4. Therein, like elements as found in FIGS. 1 and 2 bear like reference numerals, and will not be further described. In the system 10a, the handle 18a is smaller than the plug 26a, and the plug 26a is extended in width so as to form a shroud which fits over and encloses the entire handle, as best seen in FIG. 4. In this embodiment, it is virtually impossible for the module 14 to be removed from the host equipment housing so long as the handle 18a is shrouded by the plug 26a. Once the plug 26a is removed, and access to the handle 18a is obtained, removal of the module 14 from its housing is straightforward.

To those skilled in the art to which the present invention pertains, many changes in construction and widely varying embodiments will be suggested without departing from the spirit and scope of the present invention. The description and the disclosures herein are presented by way of illustration of this invention and are not limiting of the scope thereof.

I claim:

1. A connection system for a host system including a plug-in electronic module and a power supply cable for plug-in connection to said module, said system comprising:

said host system including a housing for said module effectively precluding access to said module except at one exterior end thereof, said module including an end plate at said exterior end, said end plate including handle means facilitating removal of said module from said housing, said module end plate further comprising power supply cable jack means for mating with a plug of said power supply cable, said jack means and said plug being so located and adapted to render ineffective said handle means when said plug is mated with said jack, thereby requiring service personnel to remove said power supply plug from said jack means before removing said module from said housing.

2. The connection system set forth in claim 1 wherein said handle includes an opening to provide a finger grip to facilitate removal of said module from said host equipment housing, and wherein said jack means is placed adjacent to said handle means, and further wherein said plug is sized so as to block off said opening when mated with said jack means, thereby effectively preventing removal of said module before disconnection of said power supply cable.

3. The connection system set forth in claim 1 wherein said handle is effectively surrounded by said plug when mated with said jack so that service personnel must remove said plug from said jack means in order to gain access to said handle for removing said module from said housing.

* * * * *